United States Patent [19]

Takahashi

[11] Patent Number: 5,633,720
[45] Date of Patent: May 27, 1997

[54] STAGE MOVEMENT CONTROL APPARATUS AND METHOD THEREFOR AND PROJECTION EXPOSURE APPARATUS AND METHOD THEREFOR

[75] Inventor: Masato Takahashi, Kanagawa-ken, Japan

[73] Assignee: Nikon Corporation, Toyko, Japan

[21] Appl. No.: 587,759

[22] Filed: Nov. 22, 1995

[30] Foreign Application Priority Data

Nov. 29, 1994 [JP] Japan ................... 6-294723

[51] Int. Cl.$^6$ .................................. G01B 11/00
[52] U.S. Cl. ................... 356/401; 356/399; 250/548
[58] Field of Search ................... 356/399, 400, 356/401, 358; 250/548

[56] References Cited

U.S. PATENT DOCUMENTS 4,757,207  7/1988  Chappelow et al. ........... 356/401
4,929,083  5/1990  Bruner ........................... 356/400

FOREIGN PATENT DOCUMENTS 59-103113  6/1984  Japan.

Primary Examiner—Frank Gonzalez
Assistant Examiner—Robert A. Kim
Attorney, Agent, or Firm—Armstrong, Westerman, Hattori, McLeland & Naughton

[57] ABSTRACT

When a stage moves, the position of the stage is detected by an interferometer, and a control unit controls the position of the stage while monitoring the output of the interferometer. Thus, the control unit effects positioning of the stage. In addition, the control unit calculates the square root of an arithmetic mean of the square of an error between target and present positions of the stage on the basis of the output of the interferometer, and estimates an amount of vibration of the stage on the basis of the result of the calculation, thereby enabling vibration characteristics to be quantitatively evaluated to a certain extent when the damping of vibration is rapid immediately after positioning, or when the damping is gentle or almost zero.

6 Claims, 6 Drawing Sheets

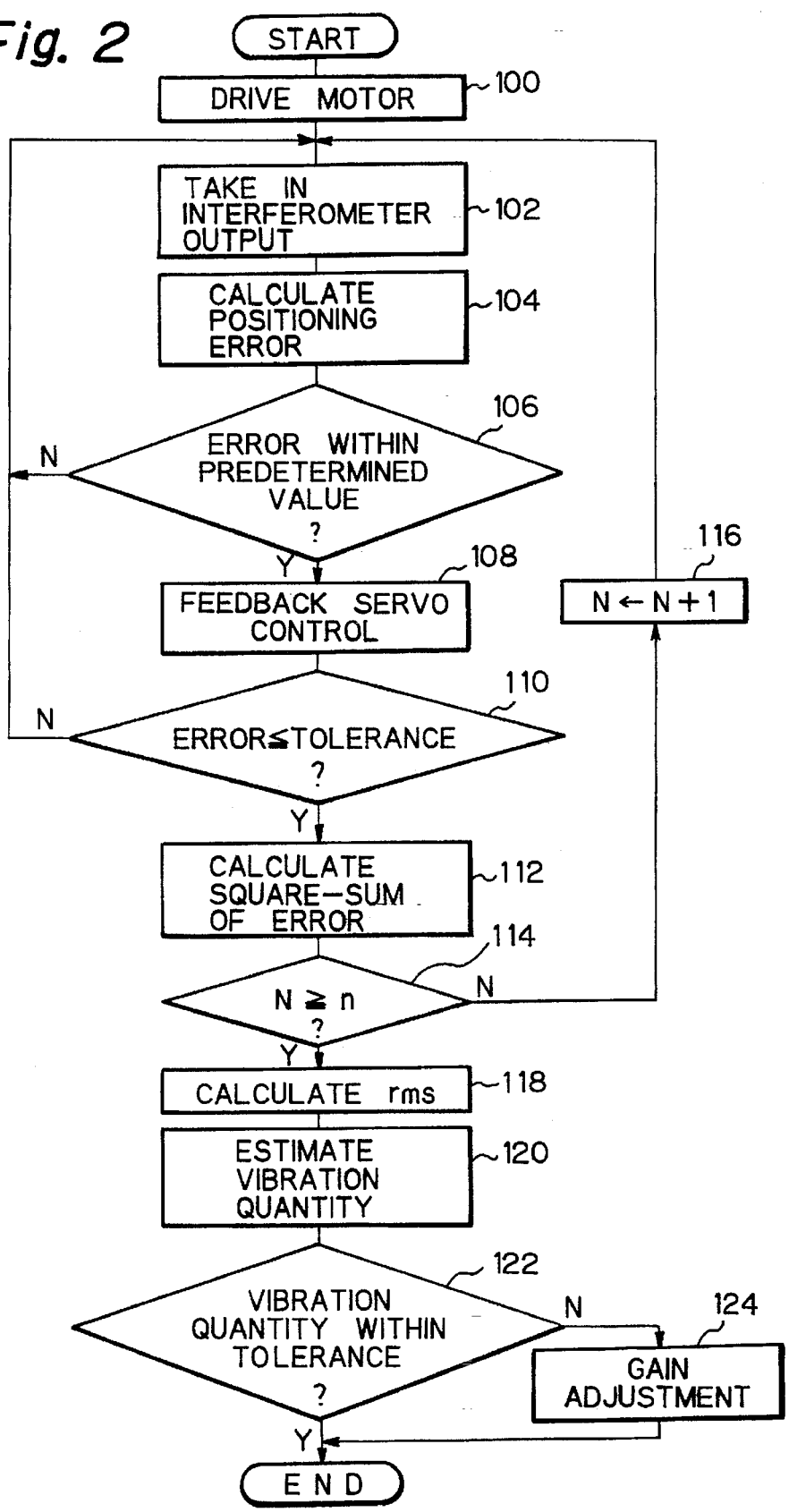

STAGE MOVEMENT CONTROL APPARATUS AND METHOD THEREFOR AND PROJECTION EXPOSURE APPARATUS AND METHOD THEREFOR

BACKGROUND OF THE INVENTION

The present invention relates to a stage movement control apparatus for controlling the position of a stage which is movable along a straight line or in two orthogonal axis directions, and also to a stage movement control method. The present invention further relates to a projection exposure apparatus which includes the above stage movement control apparatus, and also to a projection exposure method carried out by a system including the above stage movement control apparatus.

In a lithography process carried out during the production of semiconductor devices, liquid crystal display devices, etc., a projection exposure apparatus has heretofore been used to project and transfer a circuit pattern formed on a mask onto a photosensitive substrate, e.g. a wafer, a plate, etc., through a projection optical system. There are various types of projection exposure apparatus. In the production of semiconductor devices, however, the step-and-repeat photolithographic system with demagnification, i.e. so-called stepper, has become the leading projection exposure apparatus because the line width of patterns to be formed on a wafer has been reduced with the increasing degree of integration of circuits.

The stepper is designed to expose a wafer by the step-and-repeat method through a projection optical system having an exposure field capable of covering the whole pattern area of one mask (reticle). The stepper is superior in resolution, registration accuracy, etc. to aligners that employ the scanning exposure method, and is therefore considered to be the leading projection exposure apparatus in future.

However, a step-and-scan projection exposure apparatus has recently been proposed as a novel system designed to attain high resolution by improving the scanning exposure system. The step-and-scan projection exposure apparatus is a mixture of a scanning system in which, while a mask (reticle) is being one-dimensionally scanned, a wafer is one-dimensionally scanned at a speed synchronized with the scanning of the mask, and a system in which the wafer is stepwise moved.

Incidentally, projection exposure apparatuses of the above two different types are each provided with a wafer stage (XY-stage) which is movable in two orthogonal axis directions to successively expose shot regions on a wafer. In positioning of the stage, it is decided that the positioning has been completed when an error between a target position of the stage and the present position of the stage, which is obtained as an output value of an interferometer for detecting the position of the stage, has become smaller than a predetermined value. Immediately after the completion of the positioning, exposure is carried out.

However, in the above-described conventional projection exposure apparatuses, vibration of the stage during the exposure process, after the completion of the wafer stage positioning, is not monitored. Therefore, when a pattern image transferred by the exposure is degraded (unsharp), it is difficult to judge whether the degradation of the transferred image is due to the vibration of the stage or other factors. Further, the effect of the stage vibration on the degradation of the transferred image cannot be quantitatively evaluated.

Meanwhile, Japanese Patent Application Unexamined Publication (KOKAI) No. 60-32050 (85/32050) discloses "an exposure apparatus which is provided with at least one means for detecting vibration of a photosensitive material on which an image is projected and formed, so that an amount of displacement between the projected image and the photosensitive material is detected by the detecting means". However, the vibration detecting means mentioned in the invention disclosed in the publication is a sensor for directly detecting vibration of the stage, e.g., an accelerator, a micro-displacement gauge, etc., which is not a member that should inherently be provided in a projection exposure apparatus. Therefore, provision of such a detecting means causes costs to rise correspondingly.

The invention disclosed in the above publication is designed not to detect unsharpness (degradation) of the projected image caused by the vibration of the stage during exposure, but to effect positioning of the stage on the basis of the output of the vibration detecting means and not the output of an interferometer. Accordingly, the disclosed invention also suffers from the problems that, when a pattern image transferred by exposure is degraded (unsharp), it is impossible not only to judge whether the degradation of the transferred image is due to the vibration of the stage or other factors, but also to evaluate quantitatively the effect of the stage vibration on the degradation of the transferred image.

In view of the above-described problems of the prior art, a first object of the present invention is to provide a stage movement control apparatus which is capable of quantitatively evaluating vibration characteristics immediately after the completion of the stage positioning process.

A second object of the present invention is to provide a projection exposure apparatus which is capable of quantitatively evaluating the effect of the stage vibration on the degradation of the transferred image, thereby making it possible to prevent degradation of a pattern image projected and transferred onto a photosensitive substrate.

SUMMARY OF THE INVENTION

According to a first aspect of the present invention, there is provided a stage movement control apparatus for controlling the position of a stage which is movable along a straight line or in two orthogonal axis directions. The apparatus includes a position sensor for detecting the position of the stage, and a controller for controlling the position of the stage while monitoring the output of the position sensor. The apparatus further includes an arithmetic system for calculating the square root of an arithmetic mean of the square of an error between a target position of the stage and the present position of the stage on the basis of the output of the position sensor during positioning of the stage.

As the position sensor, it is preferable to use a sensor which detects the position of the stage in a non-contact manner, e.g. a capacitive non-contact displacement sensor, a semiconductor optical position detector, or a laser interferometer which is used for alignment between a projection lens and a wafer stage in general exposure apparatuses.

According to a second aspect of the present invention, the arithmetic system in the above-described apparatus estimates an amount of vibration of the stage on the basis of the result of the calculation.

According to a third aspect of the present invention, the arithmetic system in the above-described apparatus calculates the square-sum of the error by interrupt handling upon completion of positioning when the error has reached a value within a predetermined tolerance in a positioning sequence, and upon completion of the interrupt handling, the arithmetic system calculates the square root of an arithmetic mean of the square of the error by using the square-sum of the error obtained by the calculation.

According to a fourth aspect of the present invention, there is provided a projection exposure apparatus for projecting and transferring a mask pattern onto an exposure region on a photosensitive substrate placed on a stage movable in two orthogonal axis directions, while successively moving the position of the stage. The apparatus includes the stage, and a position sensor for detecting the position of the stage. The apparatus further includes a controller for controlling the position of the stage while monitoring the output of the position sensor, and a projection optical system for projecting a pattern formed in a transfer region on a mask onto an exposure region on a photosensitive substrate placed on the stage. Further, the apparatus includes an illumination system for applying illuminating light for exposure to the transfer region on the mask, and an arithmetic system for calculating the square root of an arithmetic mean of the square of an error between a target position of the stage and the present position of the stage on the basis of the output of the position sensor during positioning of the stage. In addition, the apparatus includes an adjusting system for adjusting control characteristics of the controller on the basis of the result of the calculation.

According to a fifth aspect of the present invention, there is provided a stage movement control method for controlling the position of a stage which is movable in a one- or two-dimensional direction. The method includes the steps of: detecting the position of the stage; calculating the square root of an arithmetic mean of the square of an error between a target position of the stage and the present position of the stage during positioning of the stage; and judging whether or not an amount of vibration of the stage is within a predetermined tolerance on the basis of the result of the calculation.

According to a sixth aspect of the present invention, there is provided a projection exposure method for projecting an image of a pattern formed on a mask onto a substrate on a stage movable in a two-dimensional direction. The method includes the steps of: detecting the position of the stage; calculating the square root of an arithmetic mean of the square of an error between a target position of the stage and the present position of the stage during positioning of the stage; judging whether or not an amount of vibration of the stage is within a predetermined tolerance on the basis of the result of the calculation; and adjusting control characteristics of the stage on the basis of the result of the judgment.

According to the first and fifth aspects of the present invention, when the stage moves, the position of the stage is detected by the position sensor, and the controller controls the position of the stage while monitoring the output of the position sensor. In this way, the position of the stage is controlled by the controller, and thus the positioning of the stage is effected. Upon completion of the positioning, the arithmetic system calculates the square root of an arithmetic mean of the square of an error (hereinafter referred to as "positioning error" according to circumstances) between target and present positions of the stage on the basis of the output of the position sensor, and estimates an amount of vibration of the stage on the basis of the result of the calculation.

Thus, since an amount of vibration of the stage is estimated on the basis of the square root of the arithmetic mean of the square of the positioning error, vibration characteristics can be quantitatively evaluated to a certain extent when the damping of vibration is rapid immediately after positioning, or when the damping is gentle or almost zero.

According to the third aspect of the present invention, the arithmetic system calculates the square-sum of the error by interrupt handling upon completion of positioning when the error has reached a value within a predetermined tolerance in a positioning sequence, and upon completion of the interrupt handling, the arithmetic system calculates the square root of an arithmetic mean of the square of the error by using the square-sum of the error obtained by the calculation. Accordingly, the calculation of the square-sum of the positioning error, which can be calculated in a relatively short time (e.g. about 500 µs), is performed by an interrupt handling routine in the positioning sequence, and the calculation of the square root, which requires a relatively long time, is performed after the termination of the interrupt handling. Therefore, the entire calculation can be efficiently performed.

According to the fourth and sixth aspects of the present invention, when the stage moves, the position of the stage is detected by the position sensor, and the controller controls the position of the stage while monitoring the output of the position sensor. In this way, the position of the stage is controlled by the controller, and thus the positioning of the stage is effected. Upon completion of the positioning, the arithmetic system calculates the square root of an arithmetic mean of the square of a positioning error of the stage on the basis of the output of the position sensor, and estimates an amount of vibration of the stage on the basis of the result of the calculation. The adjusting system adjusts control characteristics of the controller on the basis of the estimated amount of vibration of the stage.

In exposure process, after the positioning of the stage has been completed as described above, the transfer region on the mask is irradiated with illuminating light for exposure by the illumination system, and an image of a pattern formed in the transfer region on the mask is projected onto an exposure region on a photosensitive substrate placed on the stage through the projection optical system.

The above operation is carried out with the stage position successively moved.

Thus, an amount of vibration of the stage during actual exposure process can be quantitatively evaluated, for example, by a method wherein, before exposure, the stage is moved for positioning, and during a predetermined time (preferably the same as the exposure time), the square root of an arithmetic mean of the square of a positioning error of the stage is calculated on the basis of the output of an interferometer, and an amount of vibration of the stage is estimated on the basis of the result of the calculation. If the result of the evaluation reveals that the vibration of the stage causes the pattern image to become unsharp to such an extent that it cannot be allowed, the adjusting system adjusts control characteristics of the controller, e.g. the gain of a stage position feedback servo control system, thereby enabling an improvement in the damping factor of the vibration of the stage immediately after the positioning.

BRIEF DESCRIPTION OF THE DRAWINGS

FIG. 2 is a flowchart showing a principal control algorithm for a processor in a control unit shown in FIG. 1.

DETAILED DESCRIPTION OF PREFERRED EMBODIMENTS

First Embodiment

A first embodiment of a projection exposure apparatus according to the present invention, which includes a stage movement control apparatus of the present invention, will be described below with reference to FIGS. 1 to 6(B).

Figure 1:
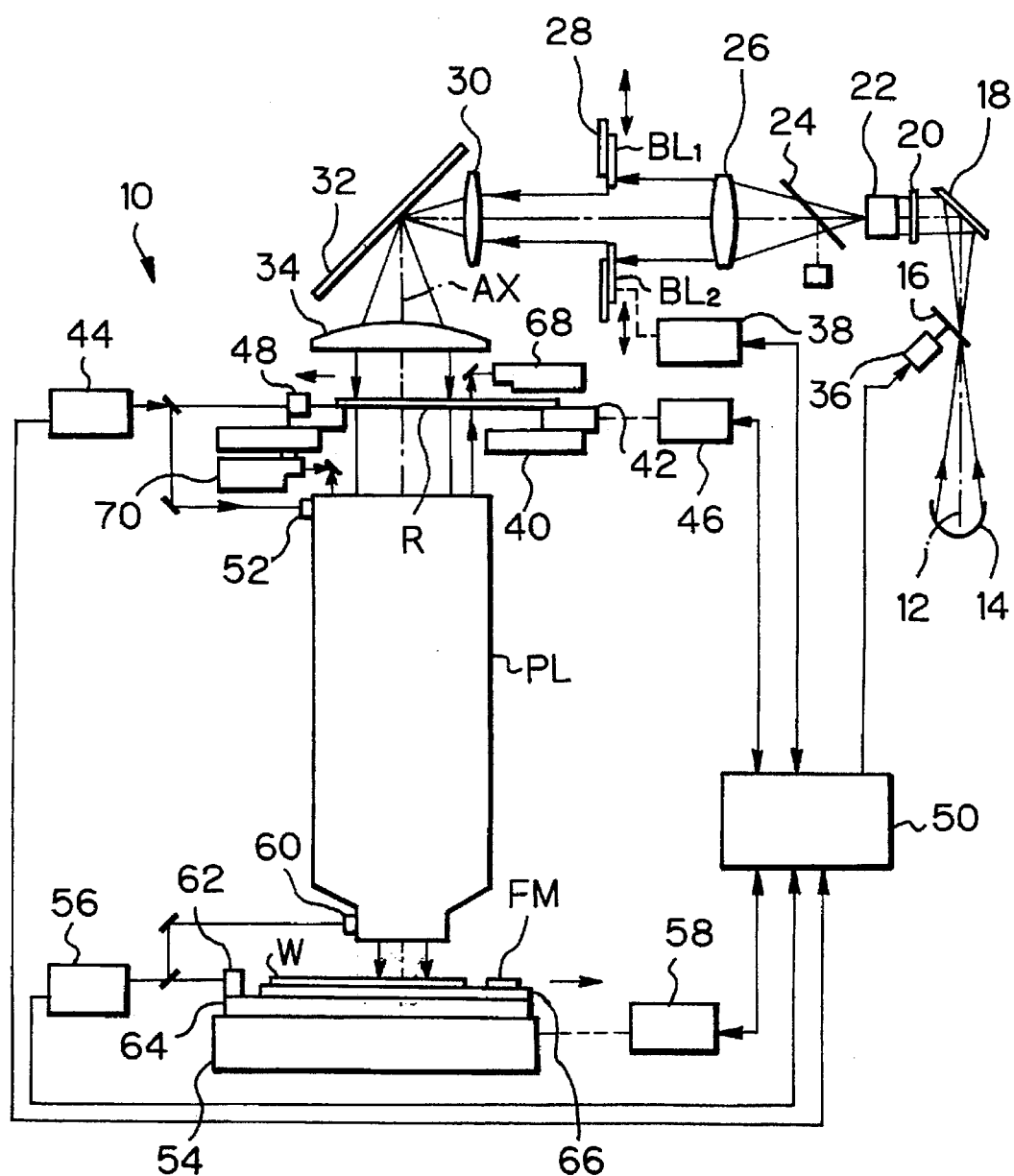
FIG. 1 schematically shows the arrangement of a projection exposure apparatus according to a first embodiment of the present invention.

FIG. 1 schematically shows the whole arrangement of a projection exposure apparatus 10 of the first embodiment.

The exposure apparatus 10 is a step-and-scan photolithographic system with demagnification. The exposure apparatus 10 has an illumination system for exposure, a reticle moving system, a projection optical system, an alignment system, a stage movement control apparatus, and so forth.

The projection optical system comprises only a refracting element which is telecentric on both sides, and which has a demagnification of $1/5$ or $1/4$. Alternatively, the projection optical system comprises a combination of a refracting and reflecting elements. In the following description, the projection optical system will be referred to as "projection lens PL" for the sake of convenience.

The illumination system for exposure includes a mercury lamp 12, an elliptic mirror 14, a rotary shutter 16, a mirror 18, an input lens 20, a fly-eye lens system 22, a beam splitter 24, a lens system 26, a reticle blind mechanism 28, a lens system 30, a mirror 32, and a main condenser lens 34. The arrangement of the illumination system, together with the function of each part thereof, will be explained below in detail.

Illuminating light for exposure from the mercury lamp 12 is converged on the secondary focus of the elliptic mirror 14 by the action of the mirror 14. The rotary shutter 16 is disposed at the secondary focus of the elliptic mirror 14. The rotary shutter 16 is driven by a motor 36 so that illuminating light is selectively intercepted or allowed to pass through the rotary shutter 16. A bundle of illuminating light rays passing through the shutter 16 is reflected by the mirror 18 to enter the fly-eye lens system 22 through the input lens 20.

The fly-eye lens system 22 prevents illuminance unevenness in an exposure range of illuminating light. A large number of secondary light source images are formed at the exit side of the fly-eye lens system 22. Illuminating light from each secondary light source image enters the lens system (condenser lens) 26 through the beam splitter 24.

The reticle blind mechanism 28, which has a plurality of movable blades ($BL_1$, $BL_2$, etc.), is disposed in the back focal plane of the lens system 26. The plurality of blades are independently moved by a drive system 38. The configuration of an aperture AP which is defined by the edges of the blades is determined so that the aperture AP is included in a circular image field IF of the projection lens PL.

Illuminating light passing through the lens system 26 has a uniform illuminance distribution at the position of the blind mechanism 28. Thereafter, the illuminating light passes through the aperture AP of the blind mechanism 28 and travels via the lens system 30, the mirror 32 and the main condenser lens 34 to illuminate a reticle R as a mask, which is disposed between the condenser lens 34 and the projection lens PL. Thus, an image of the aperture AP, which is defined by the plurality of blades ($BL_1$, $BL_2$, etc.) of the blind mechanism 28, is formed on the lower surface of the reticle R, which is defined as a pattern surface.

The reticle moving system includes a reticle stage 42 which is movable at uniform speed on a column 40 in at least a direction X (the horizontal direction as viewed in FIG. 1) with the reticle R held thereon, and a laser interferometer 44 as an example of a position sensor for measuring the position in the direction X and yawing of the reticle R through the reticle stage 42. The reticle moving system further includes a control unit 50 which controls a drive system 46 for the reticle stage 42 while monitoring the output of the laser interferometer 44. A moving mirror 48 is secured to one end (the left end as viewed in FIG. 1) of the reticle stage 42 so as to reflect a length-measuring beam emitted from the laser interferometer 44. Further, a fixed mirror (reference mirror) 52 for the laser interferometer 44 is secured to the upper end portion of the lens tube of the projection lens PL.

With the above-described arrangement, the position in the direction X and yawing of the reticle R are measured in real time by the laser interferometer 44, and the control unit 50 controls the drive system 46 on the basis of the output of the laser interferometer 44, thereby effecting one-dimensional scanning movement in the direction X of the reticle stage 42 and slight rotational movement of the reticle stage 42 for yawing correction.

In actual practice, the column 40 is formed integrally with a column (not shown) for securing the lens tube of the projection lens PL.

The stage movement control apparatus includes a laser interferometer 56 as a position sensor for detecting the position of an XY-stage 54 as a stage which is two-dimensionally movable in directions X and Y (the direction X is the horizontal direction parallel to the plane of FIG. 1; the direction Y is a direction perpendicular to the plane of FIG. 1), and a control unit 50 which controls the movement of the XY-stage 54 by controlling a drive system 58 while monitoring the output of the laser interferometer 56.

In actual practice, the laser interferometer 56 is provided for each of three measuring operations: position measurement in the X-axis direction; position measurement in the Y-axis direction; and yawing measurement. In this embodiment, however, it is assumed that both the coordinate position and yawing of the XY-stage 54 are measured with the laser interferometer 56, for the sake of simplicity. A fixed mirror 60 for the laser interferometer 56 is secured to the lower end portion of the lens tube of the projection lens PL, and a moving mirror 62 for the laser interferometer 56 is secured to one end portion of a Z-stage 64 (described later).

The Z-stage 64 is provided on the XY-stage 54. The Z-stage 64 is slightly movable in the direction of an optical axis AX (Z-axis direction) of the projection lens PL. A wafer holder 66 is provided on the Z-stage 64. Further, a wafer W as a substrate is held on the wafer holder 66 in such a manner as to be slightly rotatable. In addition, a reference mark plate FM is held on the wafer holder 66.

That is, the above-described arrangement enables the wafer W to be movable in the directions X, Y, Z and $\theta$ (rotation about the Z-axis) with 4 degrees of freedom.

As has been described above, the projection magnification in this embodiment is $1/5$, for example. Accordingly, in an in-focus state, an image of a pattern formed on the reticle R is formed on the wafer W as a ⅕ demagnified image by the projection lens PL. The speed $V_{ws}$ of movement in the direction X of the XY-stage 54 during scanning exposure is set at ⅕ of the speed $V_{rs}$ of the reticle stage 42.

The above-mentioned alignment system includes a TTR (through-the-reticle) alignment system 68 in which an alignment mark on the wafer W (or a mark on the reference mark plate FM) is detected through the reticle R and the projection lens PL, and a TTL (through-the-lens) alignment system 70 in which an alignment mark on the wafer W (or a mark on the reference mark plate FM) is detected from the space below the reticle R through the projection lens PL. With the alignment systems 68 and 70, the reticle R and the wafer W are aligned relative to each other before starting step-and-scan exposure or during scan exposure.

The control unit 50 comprises a microcomputer which is composed of a processor, ROM, RAM, I/O interface, etc. The basic operation of the control unit 50 is as follows: During scanning exposure, the control unit 50 moves the reticle stage 42 and the XY-stage 54 relative to each other with a predetermined speed ratio maintained and with the positional relationship between the reticle and wafer patterns held within a predetermined alignment error on the basis of position information and yawing information input thereto from the laser interferometers 44 and 56, and speed information input thereto from tachometer generators in the drive systems 46 and 58.

In this embodiment, the control unit 50 further effects processing for positioning of the XY-stage 54 and estimation of an amount of vibration of the XY-stage 54 during positioning, as described later.

Stage positioning processing and estimation of a vibration quantity which are carried out in the exposure apparatus 10 of this embodiment, arranged as described above, will be explained below with reference to the flowchart of FIG. 2, which shows a principal control algorithm for the processor in the control unit 50. The control algorithm is stored in the ROM (not shown), which is provided in the control unit 50.

The control algorithm starts when a positioning start command is input to the control unit 50 from an operator control panel (not shown). At this time, a timer counter (not shown), which will be described later, is simultaneously reset.

At Step 100, the drive of a motor for movement in the X-axis direction (not shown; hereinafter referred to as simply "motor"), which constitutes the drive system 58, is started.

At Step 102, the output of the interferometer 56 is taken in, and the process proceeds to Step 104 at which a positioning error (a difference between a target value and the present value, which is represented by the output of the interferometer 56) is calculated.

At the subsequent Step 106, it is judged whether or not the positioning error calculated at Step 104 is within a predetermined value. This is a judgment as to whether or not the XY-stage 54 has approached the target position. If NO is the answer at Step 106, the process returns to Step 102, and the above-described processing and judgment are repeated.

When the XY-stage 54 has approached the target position close enough to give a "YES" answer at Step 106, the process proceeds to Step 108 at which feedback servo control of the motor is effected in order to move and set the XY-stage 54 to the target position. Consequently, the motor is decelerated on the basis of the speed information from the tachometer generator in the drive system.

At the subsequent Step 110, it is judged whether or not the positioning error is within a preset tolerance. If NO is the answer at Step 110, the process returns to Step 102, and the processing and judgment at Steps 102 to 110 are repeated. When the amplitude of vibration of the XY-stage 54 has been satisfactorily reduced by the feedback servo control of the motor, YES is given as the answer at Step 110, and the process then proceeds to Step 112 at which the square-sum of the positioning error is calculated. The calculation of the square-sum is carried out by successively adding the square of a value calculated at Step 104 in the present cycle and stored in the RAM (not shown) provided in the control unit 50 to the value determined up to the preceding cycle. Accordingly, when YES is given as the answer at Step 110 for the first time, the square of the positioning error in that cycle is defined as the value of the square-sum as it is. The result of calculation at Step 112 is also stored in a predetermined area of the RAM.

At the subsequent Step 114, it is judged whether or not the count N of a timer counter (not shown) is equal to or larger than a predetermined value n. If NO is the answer, the process proceeds to Step 116 at which the counter is incremented by one. Thereafter, the process returns to Step 102. For example, the value n is determined to be an integer which is the closest to a numerical value obtained by dividing time T that is the same as the exposure time by a sampling interval t. The reason for this is to calculate the square-sum of the error for the period of time from the instant YES is given as the answer at Step 110 until the time T has elapsed.

When YES is given as the answer at Step 114 after a predetermined time has elapsed, the process proceeds to Step 118 at which rms (root mean square error: the square root of an arithmetic mean of the square of an error between the target and present positions of the XY-stage 54) is calculated. At the subsequent Step 120, an amount of vibration of the XY-stage 54 during the time T is estimated on the basis of the rms calculated at Step 118. Then, it is judged at the subsequent Step 122 whether or not the amount of vibration is within a tolerance on the basis of the result of the estimation made at Step 120. More specifically, it is judged at Step 122 whether or not the degree of unsharpness (degradation) of the reticle pattern image projected on the wafer W, which may be caused by the vibration of the XY-stage 54 when exposure is actually carried out, is within an allowable range. The tolerance may be set as follows: Experiments are carried out under various conditions which are made different in vibration characteristics by variously changing the gain of the feedback servo system, for example, so that the rms actually assumes various values, and a tolerance for the rms or for the vibration quantity estimated on the basis of the rms is determined on the basis of the results of the experiments.

That is, the damping factor of the positioning error can be varied by changing the gain of the feedback servo system. Consequently, it is possible to inhibit a reticle pattern image projected on the wafer W from being made unsharp (degraded) by vibration of the XY-stage 54 when exposure is actually carried out.

When NO is the answer at Step 122, the process proceeds to Step 124 at which the gain of the feedback servo system is adjusted. Thereafter, the control routine terminates. When YES is the answer at Step 122, the control routine is immediately terminated.

Figure 3A:
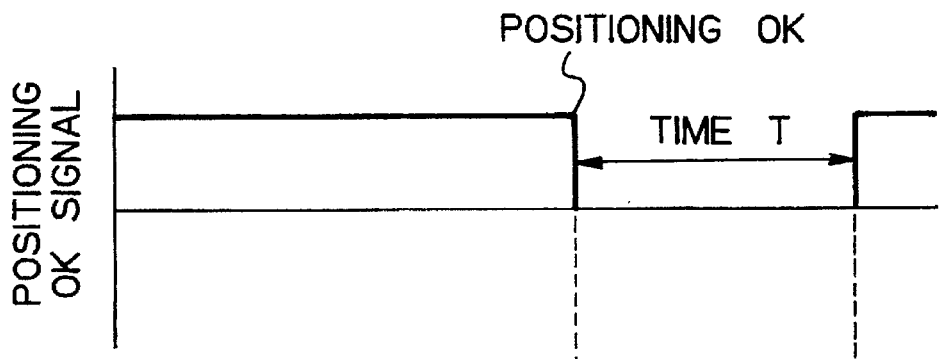
FIGS. 3(A), 3(B) and 3(C) are graphs for explaining the function of the first embodiment.
Figure 3B:
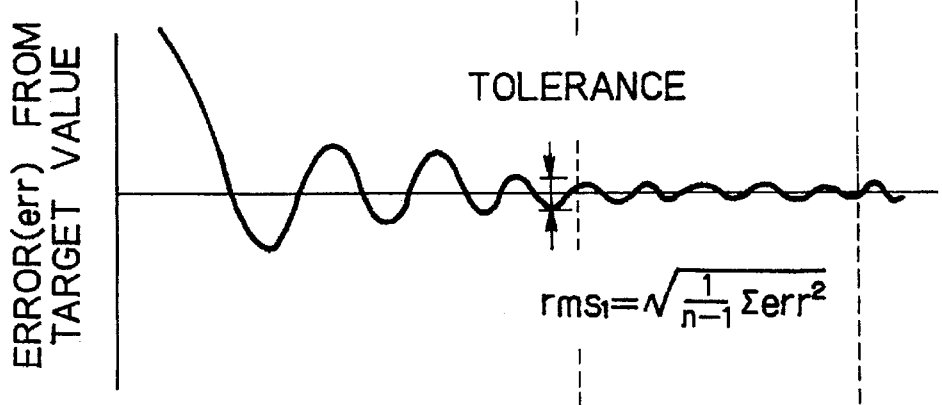
Figure 3C:
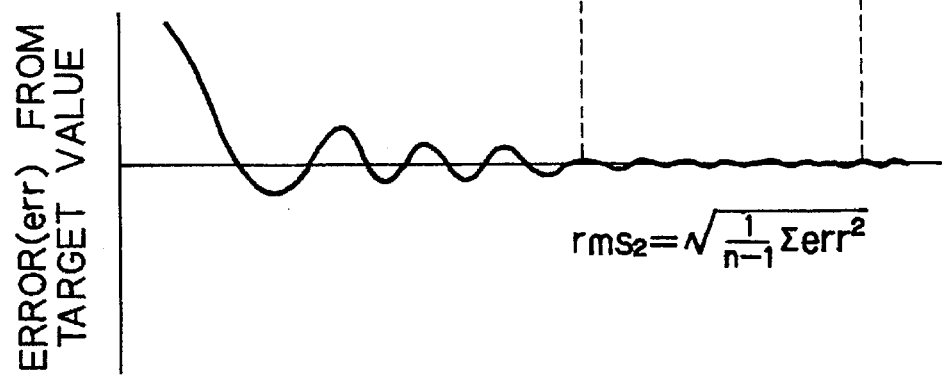

FIG. 3(A) shows the state transition of a positioning OK signal (stage drive signal) from the starting of deceleration of the motor to the time when positioning has been completed (i.e. until YES is given as the answer at Step 110), and at the time when the calculation of rms is completed, and the subsequent stage movement is to be initiated, in the above-described control routine. FIGS. 3(B) and 3(C) show the change with time of the positioning error based on the output of the interferometer in the above-described control routine until the calculation of rms is completed.

The reason why the error (err) oscillates up and down about the level 0 in FIGS. 3(B) and 3(C) is entirely that the XY-stage 54 vibrates about the target position.

In this embodiment, rms=$\sqrt{\{\Sigma err^2/n-1\}}$ is calculated in the above-described control routine. Therefore, assuming that rms in the case of FIG. 3(B) is $rms_1$, and rms in the case of FIG. 3(C) is $rms_2$, $rms_1 > rms_2$, as will be clear from the comparison between FIGS. 3(B) and 3(C). Accordingly, the judgment at Step 122 can be made, for example, such that, when the XY-stage 54 vibrates as shown in FIG. 3(B), NO is given as the answer, whereas, when the XY-stage 54 vibrates as shown in FIG. 3(C), YES is given as the answer. When NO is the answer at Step 122 as in the case of FIG. 3(B), the process proceeds to Step 124 at which the gain of the feedback servo system is changed, thereby making it possible to change the vibration characteristics of the XY-stage 54, for example, from the state shown in FIG. 3(B) to the state shown in FIG. 3(C).

Accordingly, by making the gain adjustment as described above before exposure, it is possible to prevent the projected image from being made unsharp by the effect of the vibration of the XY-stage 54 during positioning when exposure is actually carried out. Even if the projected image becomes unsharp, since the stage vibration characteristics have already been adjusted by the above-described control routine, it can be readily judged that the projected image is made unsharp by a cause other than the vibration of the XY-stage 54.

As will be clear from the foregoing description, in this embodiment, a controller, an arithmetic system and an adjusting system are realized by the function of the control unit 50.

Next, the way in which exposure is carried out in this embodiment will be described. Before the description of the exposure process, the reticle R will be briefly explained below.

Figure 4:
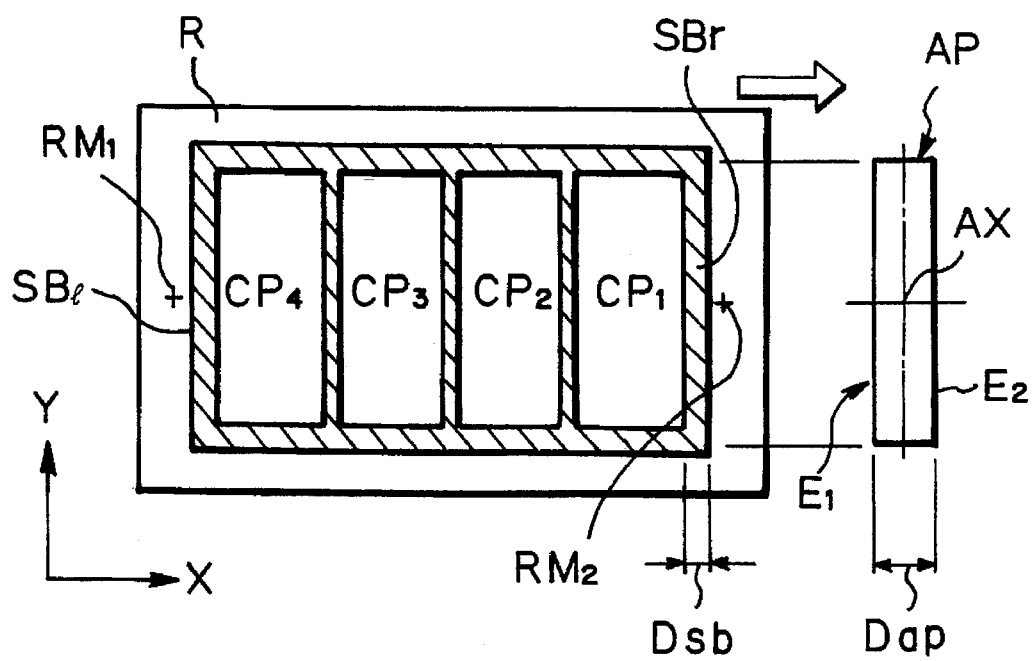
FIG. 4 shows the positional relationship between a reticle, which can be fitted into the exposure apparatus shown in FIG. 1, and the aperture of a blind mechanism.

FIG. 4 shows the reticle R, which can be fitted into the exposure apparatus 10. It is assumed that the reticle R has left and right shielding belts $SB_1$ and $SB_r$ at the periphery of the shot region thereof, and reticle alignment marks $RM_1$ and $RM_2$ are formed outside the shielding belts $SB_1$ and $SB_r$.

Next, the step-and-scan exposure process in this embodiment will be explained. A control algorithm for a series of processing operations described below has been stored in the ROM of the control unit 50. The control algorithm is executed by the processor in the control unit 50.

First, the XY-stage 54 is moved to and set in a predetermined position to carry out exposure for a first shot on the wafer W. The positioning process is executed in the same way as at Steps 100 to 110 in the above-described flowchart.

Thereafter, the reticle R and the wafer W are aligned relative to each other by a known technique using the alignment systems 60 and 62, a photoelectric sensor, etc. However, since the alignment process is not closely related to the present invention, detailed description thereof is herein omitted.

In this state, exposure for first shot is carried out as follows:

First, the reticle R is set at a scanning start point in the direction X. Similarly, one corresponding shot region on the wafer W is set at a scanning start position in the direction X.

Next, the reticle stage 42 and the XY-stage 54 are moved in respective directions which are opposite to each other with a speed ratio proportional to the projection magnification.

From the time when an image of an edge $E_2$ of a blade ($BL_2$) comes to the shielding belt $SB_r$ at the right side of the shot region of the reticle R in FIG. 4, the blade ($BL_2$) is moved to synchronously with the speed of movement of the reticle R. The movement of the blade $BL_2$ is suspended when the aperture AP defined by the edge $E_2$ reaches a predetermined aperture width (e.g. from 5 mm to 10 mm).

Thus, the reticle R is fed in the direction X at a predetermined speed while being irradiated with illuminating light passing through the predetermined aperture AP. From the time when an image of the edge $E_1$ of a blade ($BL_1$) comes to the shielding belt $SB_l$ at the left side of the shot region of the reticle R in FIG. 4, the image of the edge $E_1$ of the blade ($BL_1$) is run in the same direction synchronously with the speed of movement of the reticle R.

At the time when the left-hand shielding belt $SB_l$ is shielded by the image of the edge $E_2$ of the right-hand blade $BL_2$, the movements of the reticle stage 42 and the blade $BL_1$ are suspended.

By the above-described operation, exposure (for one shot) by one scan of the reticle R is completed, and thus the shutter 16 is closed.

Next, the XY-stage 54 is stepped in the direction Y by a distance corresponding to one column of shot regions, and then the XY-stage 54 and the reticle stage 42 are scanned in respective directions which are reverse to those in the preceding scanning exposure, thereby carrying out similar scanning exposure for a different shot region on the wafer W. Thereafter, the same operation is repeated to successively carry out exposure for different shot regions according to a predetermined order.

As has been described above, the first embodiment of the present invention provides the following advantageous effects: If the positioning process, the estimation of an amount of vibration of the XY-stage 54, and the adjustment of the gain of the feedback servo control system, which are shown in the flowchart of FIG. 2, are executed before exposure, the vibration of the XY-stage 54 during the actual exposure process can be substantially ignored because the XY-stage 54 performs uniform linear motion in the X-axis direction. Therefore, it is possible to prevent the projected image from being made unsharp by the effect of vibration of the XY-stage 54 occurring during the positioning process. If the projected image becomes unsharp after the gain of the feedback servo control system has been adjusted, since the stage vibration characteristics have already been adjusted, it can be readily judged that the projected image is made unsharp by a cause other than the vibration of the XY-stage 54.

It should be noted that, when the size in the direction Y of one shot region is larger than the largest size in the direction Y of the aperture AP, it is preferable to carry out overlap exposure inside each shot region so as to effect seamless exposure, as described in Japanese Patent Application Unexamined Publication (KOKAI) No. 2-229423 (90/229423).

It should be noted that, if the illuminating light intensity is kept constant during scanning exposure, the absolute velocity of the reticle stage 42 and the XY-stage 54 must be increased as the largest width in the scanning direction of the aperture AP increases. Assuming that the same exposure volume (dose volume) is applied to the resist on the wafer W, if the width of the aperture AP is doubled, the speeds of the XY-stage 54 and the reticle stage 42 must also be doubled in theory.

Second Embodiment

Next, a second embodiment of the present invention will be described with reference to FIGS. 5 to FIG. 6(B). In this embodiment, constituent elements which are identical or equivalent to those in the first embodiment are denoted by the same reference numerals, and description thereof is omitted or simplified.

Figure 5:
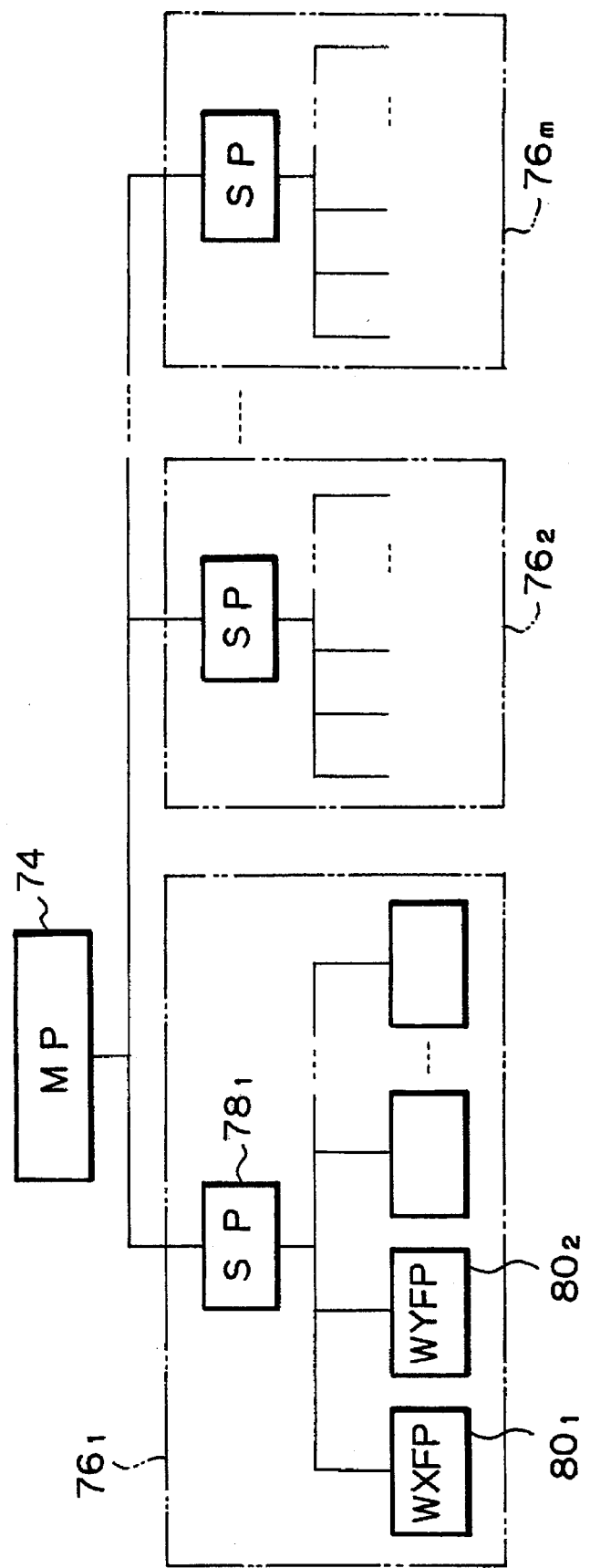
FIG. 5 is a block diagram schematically showing the whole arrangement of a control system in a projection exposure apparatus according to a second embodiment of the present invention.

FIG. 5 schematically shows the whole control system of an exposure apparatus according to the second embodiment. The control system comprises a master processor (MP) 74 which controls the flow of jobs throughout the apparatus, and a plurality of controllers $76_1$, $76_2$, ..., $76_m$, which are under the control of the master processor 74.

The master processor 74 comprises a mini computer. The stage controller $76_1$ is equivalent to the above-described control unit 50. The other controllers $76_2$, ..., $76_m$ are an illumination system controller, a lens controller, an alignment controller, and so forth. In actual practice, the controllers $76_1$, $76_2$, ..., $76_m$ are accommodated in a rack (not shown) which accommodates the master processor 74 as a control board.

The stage controller $76_1$ includes a slave processor (SP) $78_1$ placed under the control of a master processor, and a plurality of processors placed under the control of the slave processor $78_1$, i.e. a wafer X function processor (WXFP) $80_1$, a wafer Y function processor (WYFP) $80_2$, etc. The arrangements of the other constituent elements, i.e. the illumination system for exposure, the reticle moving system, the projection optical system, the alignment system, the stage movement control apparatus, etc., are the same as in the first embodiment.

Next, arithmetic processing of rms for estimating a vibration quantity and other processing in the second embodiment will be explained with reference to the flowcharts of FIGS. 6(A) and 6(B), which show principal control algorithms for the wafer X function processor (WXFP) $80_1$.

Figure 6A:
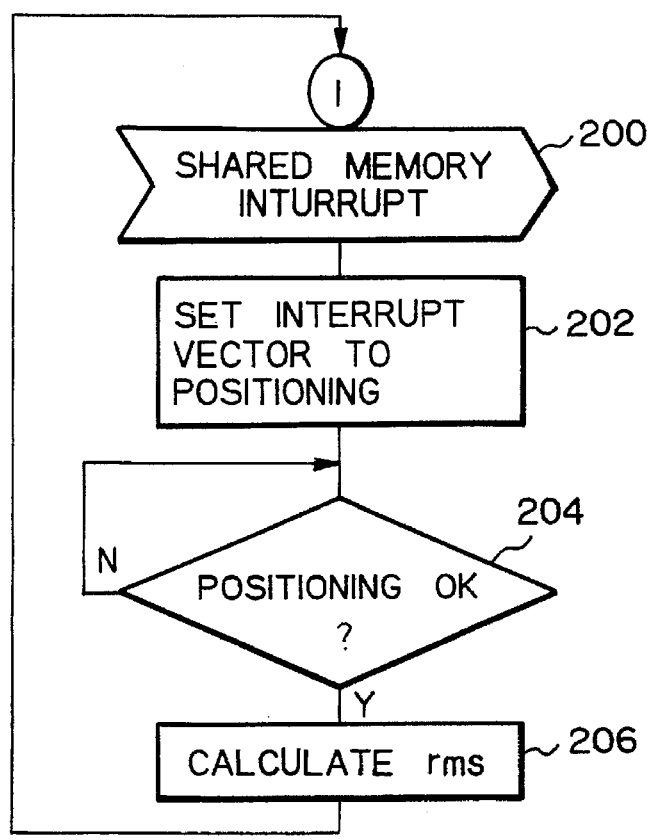
FIG. 6(A) is a flowchart of a principal control algorithm for a wafer X function processor (WXFP) shown in FIG. 5, illustrating a positioning sequence.
Figure 6B:
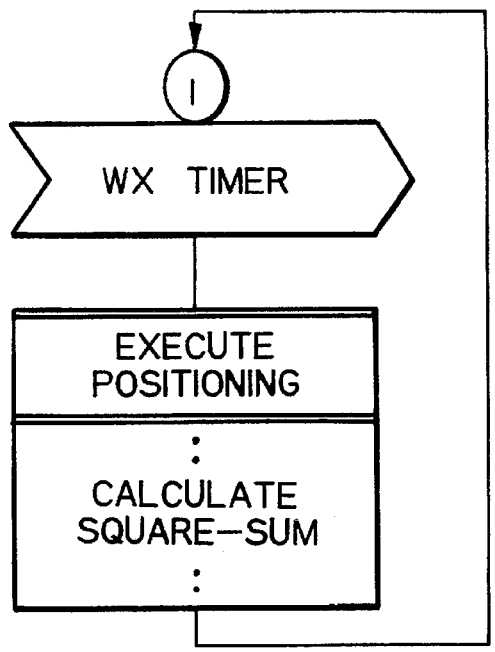
FIG. 6(B) is a flowchart of a principal control algorithm for the wafer X function processor (WXFP) shown in FIG. 5, illustrating an interrupt handling routine.

FIG. 6(A) shows a positioning sequence executed by the WXFP $80_1$, and FIG. 6(B) shows an interrupt handling routine executed during the positioning sequence shown in FIG. 6(A).

When a shared memory interrupt is caused from the slave processor $78_1$ at Step 200, the process proceeds to Step 202 at which an interrupt vector is set to positioning. Consequently, the interrupt vector contains the address of a shared memory at which the interrupt handling routine has been stored. Therefore, when positioning is executed, the interrupt handling routine is started.

At the subsequent Step 204, the control process waits for the completion of positioning of the XY-stage 54 (since the way in which the XY-stage 54 is positioned has been described in detail in the first embodiment, description thereof is herein omitted). When the positioning is judged to be OK, the interrupt handing routine shown in FIG. 6(B) is executed. The interrupt handling routine is repeatedly executed at intervals of 0.5 ms, for example, for time T specified by a wafer X timer (WX timer: interrupt handling timer) that determines an operating timing of an interrupt controller (not shown) in the WXFP $80_1$.

That is, by the interrupt handling, the calculation of the square-sum of the positioning error is repeatedly executed at intervals of 0.5 ms. It is assumed that a difference between a mean value of X-coordinate values and the present X-coordinate value is used as a positioning error. It will be understood by looking at the parts "Time T" in the graphs of FIGS. 3(B) and 3(C) that the positioning error (err) oscillates up and down about the level 0, and that a mean value of X-coordinate values coincides with the target value, and further that the difference between the mean value of X-coordinate values and the present X-coordinate value is none other than the positioning error. Accordingly, the calculation of the square-sum S of the positioning error is performed on the basis of the following equation:

$$S = \sum_{i=1}^{n} (\overline{X} - X_i)^2$$

If the time T is determined to be the same as the exposure time, for example, since the exposure time is usually set at about 200 ms, and the calculation is executed at sampling intervals of 0.5 ms, n in the above equation is 400, i.e. n=400.

After the calculation of the square-sum has been executed a predetermined times n by the interrupt handling routine, rms is calculated at Step 206 on the basis of the following equation:

$$rms = \sqrt{\left\{ \frac{1}{n-1} \sum_{i=1}^{n} (\overline{X} - X_i)^2 \right\}}$$

Accordingly, it is possible in this case also to quantitatively estimate an amount of vibration of the XY-stage 54 during the time T on the basis of the result of calculation at Step 206.

As has been described above, the second embodiment provides advantageous effects equivalent to those obtained by the first embodiment. In addition, rms is calculated in such a manner that only the calculation of the square-sum of the error (err), which can be calculated in a relatively short time, is performed in an interrupt handling routine which is executed during the positioning sequence, and the calculation of the square root, which requires a relatively long time, is performed by the positioning sequence. Therefore, the arithmetic operation time can be shortened in comparison to the first embodiment.

Thus, according to the present invention, an amount of vibration of the stage is estimated on the basis of the square root of an arithmetic mean of the square of a positioning error. Therefore, vibration characteristics can be quantitatively evaluated to a certain extent when the damping of vibration is rapid immediately after positioning, or when the damping is gentle or almost zero. Accordingly, in a case where the method of the present invention is used for a wafer stage of a projection exposure apparatus, for example, if the projected image becomes unsharp during exposure process, it is possible to judge whether the projected image is made unsharp by the vibration of the stage or by other causes.

According to another aspect of the present invention, the calculation of the square-sum of the positioning error, which can be calculated in a relatively short time, is performed by an interrupt handling routine in the positioning sequence, and the calculation of the square root, which requires a relatively long time, is performed after the termination of the interrupt handling. Accordingly, it is possible to obtain the advantage that the entire calculation can be efficiently performed, in addition to the above-described advantages.

According to still another aspect of the present invention, an amount of vibration of the stage during actual exposure process can be quantitatively evaluated by a method wherein, before exposure, the stage is moved for positioning, and during a predetermined exposure time, the square root of an arithmetic mean of the square of a positioning error of the stage is calculated on the basis of the output of an interferometer, and an amount of vibration of the stage is estimated on the basis of the result of the calculation. Thus, it is possible to adjust the vibration characteristics of the stage, if necessary, according to the result of the evaluation. Accordingly, in actual exposure process, the vibration of the stage can be adjusted within a predetermined tolerance. Thus, it is possible to prevent degradation of a pattern image projected on a photosensitive substrate.

Although in the foregoing embodiments the present invention is applied to a step-and-scan photolithographic system with demagnification, it should be noted that the applicability of the present invention is not necessarily limited thereto, and that the present invention is generally applicable to so-called steppers, as a matter of course.

What is claimed is:

1. A stage movement control apparatus for controlling a position of a stage which is movable along a straight line or in two orthogonal axis directions, said apparatus comprising:

a position sensor for detecting a position of said stage;

a controller for controlling the position of said stage while monitoring an output of said position sensor; and an arithmetic system for calculating a square root of an arithmetic mean of a square of an error between a target position of said stage and a present position of said stage on the basis of the output of said position sensor during positioning of said stage.

2. An apparatus according to claim 1, wherein said arithmetic system estimates an amount of vibration of said stage on the basis of a result of said calculation.

3. An apparatus according to claim 1, wherein said arithmetic system calculates a square-sum of said error by interrupt handling upon completion of positioning when said error has reached a value within a predetermined tolerance in a positioning sequence, and upon completion of said interrupt handling, said arithmetic system calculates a square root of an arithmetic mean of a square of the error by using the square-sum of the error obtained by said calculation.

4. A projection exposure apparatus for projecting and transferring a mask pattern onto an exposure region on a photosensitive substrate placed on a stage movable in two orthogonal axis directions, while successively moving a position of said stage, said apparatus comprising:

said stage;

a position sensor for detecting a position of said stage;

a controller for controlling the position of said stage while monitoring an output of said position sensor;

a projection optical system for projecting a pattern formed in a transfer region on a mask onto an exposure region on a photosensitive substrate placed on said stage;

an illumination system for applying illuminating light for exposure to the transfer region on said mask;

an arithmetic system for calculating a square root of an arithmetic mean of a square of an error between a target position of said stage and a present position of said stage on the basis of the output of said position sensor during positioning of said stage; and an adjusting system for adjusting control characteristics of said controller on the basis of a result of said calculation.

5. A stage movement control method for controlling a position of a stage which is movable in a one- or two-dimensional direction, said method comprising the steps of:

detecting a position of said stage;

calculating a square root of an arithmetic mean of a square of an error between a target position of said stage and a present position of said stage during positioning of said stage; and judging whether or not an amount of vibration of said stage is within a predetermined tolerance on the basis of a result of said calculation.

6. A projection exposure method for projecting an image of a pattern formed on a mask onto a substrate on a stage movable in a two-dimensional direction, said method comprising the steps of:

detecting a position of said stage;

calculating a square root of an arithmetic mean of a square of an error between a target position of said stage and a present position of said stage during positioning of said stage;

judging whether or not an amount of vibration of said stage is within a predetermined tolerance on the basis of a result of said calculation; and adjusting control characteristics of said stage on the basis of a result of said judgment.

* * * * *